(12) United States Patent
Jung

(10) Patent No.: US 6,329,678 B1
(45) Date of Patent: Dec. 11, 2001

(54) SEMICONDUCTOR MEMORY ARRAY

(75) Inventor: Tae-Hyung Jung, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/451,852

(22) Filed: Dec. 1, 1999

(30) Foreign Application Priority Data

Dec. 4, 1998 (KR) .................................................. 98/53130

(51) Int. Cl.[7] .................................................. H01L 27/10
(52) U.S. Cl. .................. 257/202; 257/206; 257/208; 257/390; 257/909; 257/910
(58) Field of Search .................................. 257/202, 206, 257/208, 390, 909, 910

(56) References Cited

U.S. PATENT DOCUMENTS

| | | | |
|---|---|---|---|
| 5,335,203 | * 8/1994 | Ishii et al. | 365/226 |
| 5,894,448 | * 4/1999 | Amano et al. | 365/230.08 |
| 5,966,316 | * 10/1999 | Tsukikawa | 365/51 |
| 6,064,606 | * 5/2000 | Kuroda et al. | 365/200 |

* cited by examiner

*Primary Examiner*—Eddie Lee
*Assistant Examiner*—Matthew E. Warren
(74) *Attorney, Agent, or Firm*—Morgan, Lewis & Bockius LLP

(57) ABSTRACT

A semiconductor memory array for improving packaging reliability and device speed is disclosed in the present invention. The semiconductor memory array includes a peripheral device region in a center portion of the array, a plurality of memory mat regions enclosing the peripheral device region, a pad region formed in the peripheral device region, a plurality of array control regions between the memory mat regions, each array control region horizontally adjacent to a memory mat region, and a plurality of main amplifier regions disposed between the memory mat regions and the peripheral device region.

19 Claims, 10 Drawing Sheets

SEMICONDUCTOR MEMORY ARRAY

This application claims the benefit of Korean Application No. 98-53130 filed Dec. 4, 1998, which is hereby incorporated by reference.

BACKGROUND OF THE INVENTION

1. Field of the Invention

The present invention relates to a semiconductor memory device, and more particularly, to a semiconductor memory array. Although the present invention is suitable for a wide scope of applications, it is particularly suitable for improving a packaging reliability, respective AC parameters, and device speed.

2. Description of the Related Art

FIG. 1 is a block diagram illustrating a related background art semiconductor memory array. As shown therein, a first Y decoder 12-1 and a first X decoder 11-1 are disposed at the lower end and the right side of a first memory mat MAT1, respectively. A second Y decoder 12-2 and the second X decoder 11-2 are disposed at the upper end and the right side of a second memory mat MAT2, respectively.

An array control region 13 is located between the first Y decoder 12-1 and the first X decoder 11-1, and the second Y decoder 12-2 and the second X decoder 11-2. A main amplifier region 20 is positioned at the right side of a memory mat region 10 including 6he first and second memory mats MAT1, MAT2, the array control region 13, the first and second X decoders 11-1, 11-2 and the first and second Y decoders 12-1, 12-2.

A peripheral device region 30 is disposed to surround a region where the memory mat region 10 and the main amplifier region 20 are located. First and second pad regions 41, 42 are respectively disposed at the left and right sides of the peripheral device region 30 to access the first and second memory mats MAT1, MAT2. Here, power pins are excluded from the first and second pad regions 41, 42.

The above described background art semiconductor memory array has the pad regions 41, 42 disposed at both sides of the first and second memory mats MAT1, MAT2 to access the first and second memory mats MAT1, MAT2. Thus, a device speed is decreased due to large chip size resulting from a higher integration.

FIG. 2 is a block diagram illustrating a background art LOC (lead-on-chip) type semiconductor memory array. As shown therein, first and second main amplifier regions 21, 22 are disposed at the upper end and the lower end of first and second memory mat regions MAT1', MAT2', respectively. First and second peripheral device regions 31, 32 are disposed adjacent to the first and second main amplifier regions 21, 22. A pad region 40 is located between the first and second peripheral. device regions 31, 32 so as to access the first and second memory mat regions MAT1', MAT2'. Here, power pins are excluded from the pad region 40.

FIG. 3 is a block diagram illustrating a conventional 64M SDRAM array. As shown therein, 16M bits of first to fourth mats MAT1, MAT2, MAT3, and MAT4 are arrayed in a checkerboard pattern. First to fourth X decoders 11-1, 11-2, 11-3, and 11-4 are disposed at the left or right side of the first to fourth memory mats MAT1, MAT2, MAT3, and MAT4. First to fourth Y decoders 121, 12-2, 12-3, and 12-4 are disposed at the lower end or upper end of the first to fourth memory mats MAT1, MAT2, MAT3, and MAT4. First and second array control regions 13-1, 13-2 are disposed between the first and second X decoders 11-1, 11-2 and between the third and fourth X decoders 11-3, 11-4.

First and second main amplifier regions 21, 22 are disposed at the lower end and the upper end of a first memory mat region 11 including the first and second memory mats MAT1, MAT2, the first and second X decoders 11-1, 11-2, the first and second Y decoders 12-1, 12-2 and the first array control region 13-1, and a second memory mat region 12 including the third and fourth memory mats MAT3, MAT4, the third and fourth X decoders 11-3, 11-4, the third and fourth Y decoders. 12-3, 12-4 and the second array control region 13-2.

First and second peripheral device regions 31, 32 are disposed adjacent to the first and second main amplifier regions 21, 22, respectively. A pad region 40 is disposed between the first and second peripheral device regions 31, 32 so as to access the first to fourth memory mats MAT1, MAT2, MAT 3, and MAT4. Here, power pins are excluded from the pad region 40.

FIG. 4 is a block diagram illustrating a conventional 128M SDRAM array. As shown therein, 16M bits of first to eighth mats MAT1 to MAT8 are arrayed in a checkerboard pattern. First to eighth X decoders 11-1 to 11-8 are disposed at the left or right side of the first to eighth memory mats MAT1 to MAT8. First to eighth Y decoders 12-1 to 12-8 are disposed at the lower end or upper end of the first to eighth memory mats MAT1 to MAT8. First to fourth array control regions 13-1 to 13-4 are disposed between the first and second X decoders 11-1, 11-2, between the third and fourth X decoders 11-3, 11-4, between the fifth and sixth X decoders 11-5, 11-6, and between the seventh and eighth X decoders 11-7, 11-8.

Here, a first memory mat region 11 includes the first and second memory mats MAT1, MAT2, the first and second X decoders 11-1, 11-2, the first and second Y decoders 12-1, 12-2, and the first array control region 13-1. Likewise, second to fourth memory mat regions 12 to 14 include memory mats, X decoders, Y decoders, and array control regions. First and second main amplifier regions 21, 22 are disposed at the upper end and the lower end of the second memory mat region 12 and the third memory mat region 13, respectively. First and second peripheral device regions 31, 32 are disposed at the upper end and the lower end of the first and second main amplifier regions 21, 22. A pad region 40 is disposed between the first and second peripheral device regions 31, 32 so as to access the first to eight memory mats MAT1 to MAT8. Here, power pins are excluded from the pad region 40.

FIG. 5 is a block diagram illustrating another conventional 128M SDRAM array. As shown therein, 16M bits of first to eighth mats MAT1 to MAT8 are arrayed in a checkerboard pattern. First to eighth X decoders 11-1 to 11-8 are disposed at the left or right side of the first to eighth memory mats MAT1 to MAT8. First to eighth Y decoders 12-1 to 12-8 are disposed at the upper end or lower end of the first to eighth memory mats MAT1 to MAT8. First and fourth array control regions 13-1 to 13-4 are disposed between the first and second X decoders 11-1, 11-2, between the third and fourth X decoders 11-3, 11-4, between the fifth and sixth X decoders 11-5, 11-6, and between the seventh and eighth X decoders 11-7, 11-8, respectively.

Here, a first memory mat region 11 includes the first and second memory mats MAT1, MAT2, the first and second X decoders 11-1, 11-2, the first and second Y decoders 12-1, 12-2, and the first array control region 13-1. Likewise, second to fourth memory mat regions 12 to 14 include memory mats, X decoders, Y decoders, and array control regions.

First to fourth main amplifier regions 21 to 24 are disposed at the upper end and the lower end of the first to fourth memory mat regions 11 to 14. A peripheral device region 30 is disposed between the third and fourth memory mat regions 11, 12 and the third and fourth memory mat regions 13, 14. A pad region 40 is disposed within the peripheral device regions between the first and second peripheral device regions 31, 32 so as to access the first to eight memory mats MAT1 to MAT8. Here, power pins are excluded from the pad region 40.

When fabricating a 128M DRAM in accordance with the present design rule (i.e., 0.023 μm of line width, fourth generation 64M DRAM), the device tends to be elongated toward one direction during packaging, thereby deteriorating a reliability in production.

Specifically, in case of the 128M DRAM, although the packaging is possible if the major axial length is shorter than 21 mm and the minor axial length is shorter than 9 mm, a silicon substrate may be bent toward the major axial length, thereby deteriorating a reliability in packaging.

Also, too much elongated chip may cause a delay in AC parameters and internal signals so that a speed of the device is much reduced.

SUMMARY OF THE INVENTION

Accordingly, the present invention is directed to a semiconductor memory array that substantially obviates one or more of the problems due to limitations and disadvantages of the related art.

Another object of the present invention to provide an improved semiconductor memory array wherein a pad region is surrounded by a memory mat and a major axial length is decreased, thereby improving a packaging reliability, respective AC parameters, and device operating speed.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor memory array includes a peripheral device region in a center portion of the array, a plurality of memory mat regions enclosing the peripheral device region, a pad region formed in the peripheral device region, a plurality of array control regions between the memory mat regions, each array control region horizontally adjacent to a memory mat region, and a plurality of main amplifier regions disposed between the memory mat regions and the peripheral device region.

In another aspect of the present invention, a semiconductor memory array includes a plurality of memory mat regions arranged in a checkerboard pattern, an array control region disposed between the horizontally adjacent memory mat regions, a peripheral device region disposed between vertically adjacent memory mat regions, the peripheral device region being surrounded by the memory mat regions, and a pad region disposed in the peripheral device region.

In a further aspect of the present invention, a semiconductor memory array includes a peripheral device region, a plurality of memory mat regions formed in a checkerboard pattern, each memory mat region contacting the peripheral device region, a pad region formed in the peripheral device region, a plurality of array control regions between the memory mat regions, each array control region horizontally adjacent to a memory mat region, and a plurality of main amplifier regions disposed between the memory mat regions and the peripheral device region.

It is to be understood that both the foregoing general description and the following detailed description are exemplary and explanatory and are intended to provide further explanation of the invention as described.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
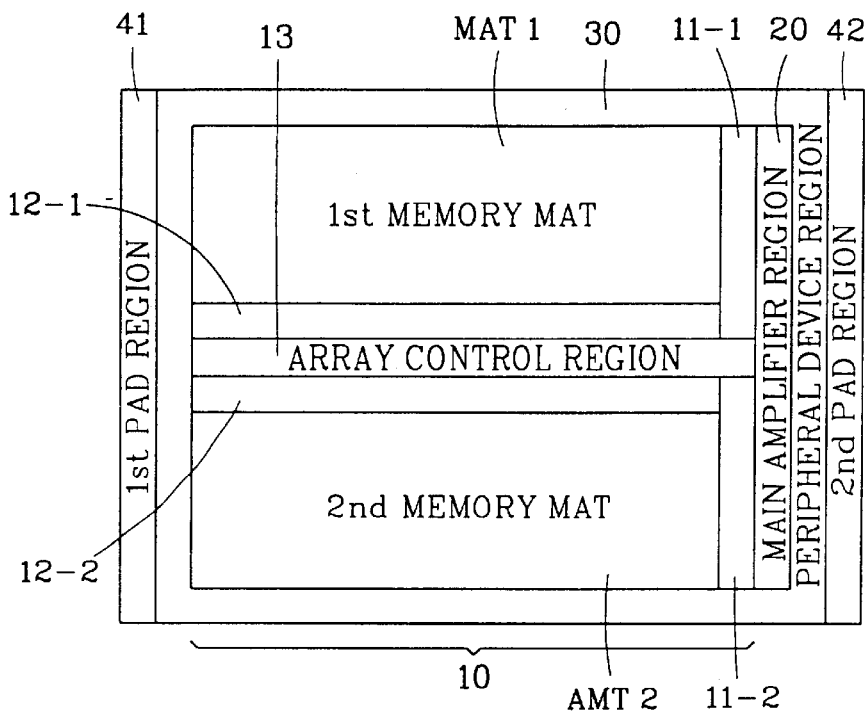
FIG. 1 is a block diagram illustrating a background art semiconductor memory array.
Figure 2:
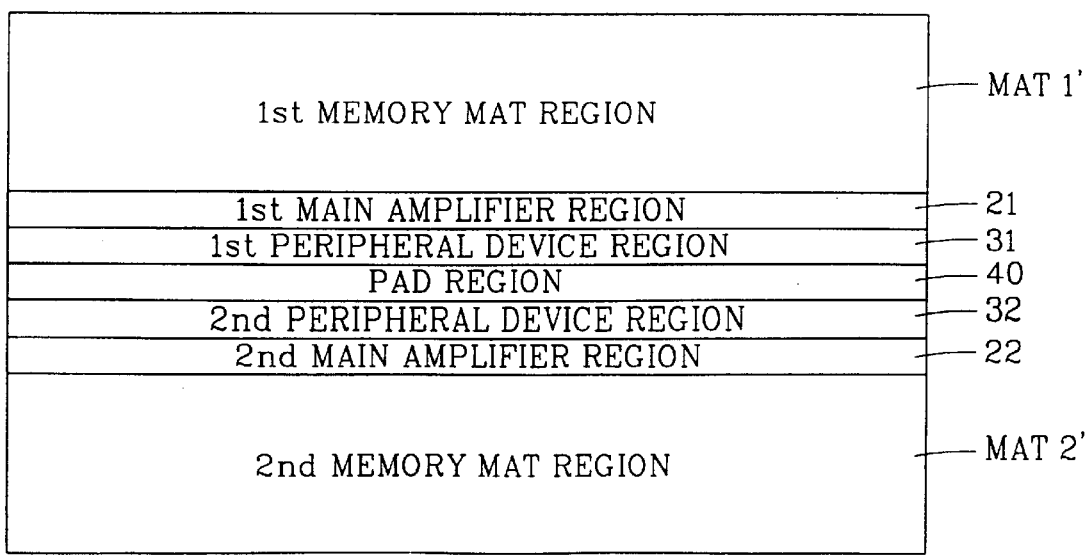
FIG. 2 is a block diagram illustrating a background art LOC (lead-on-chip) type semiconductor memory array.
Figure 3:
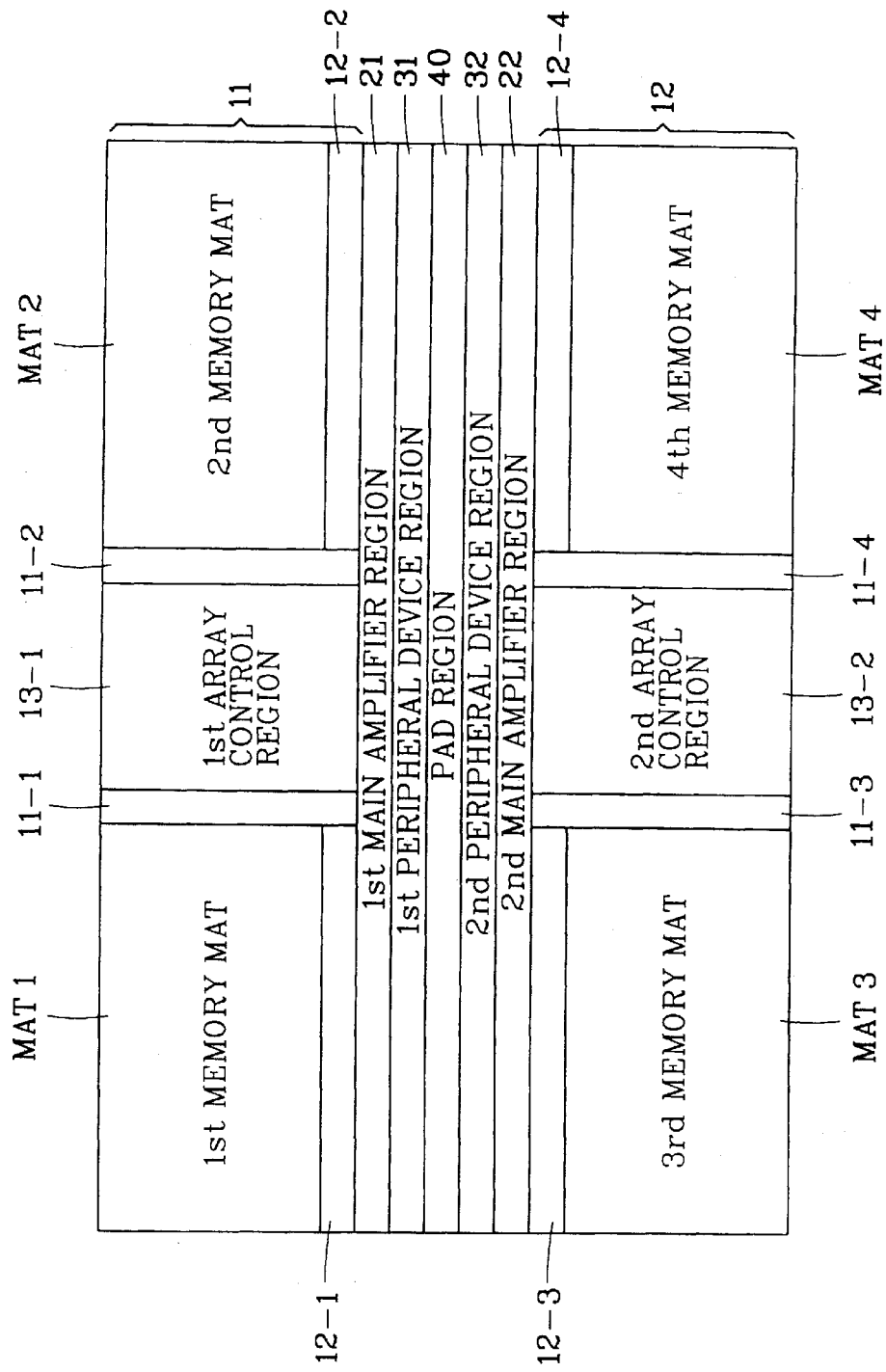
FIG. 3 is a block diagram illustrating a background art 64M SDRAM array.
Figure 4:
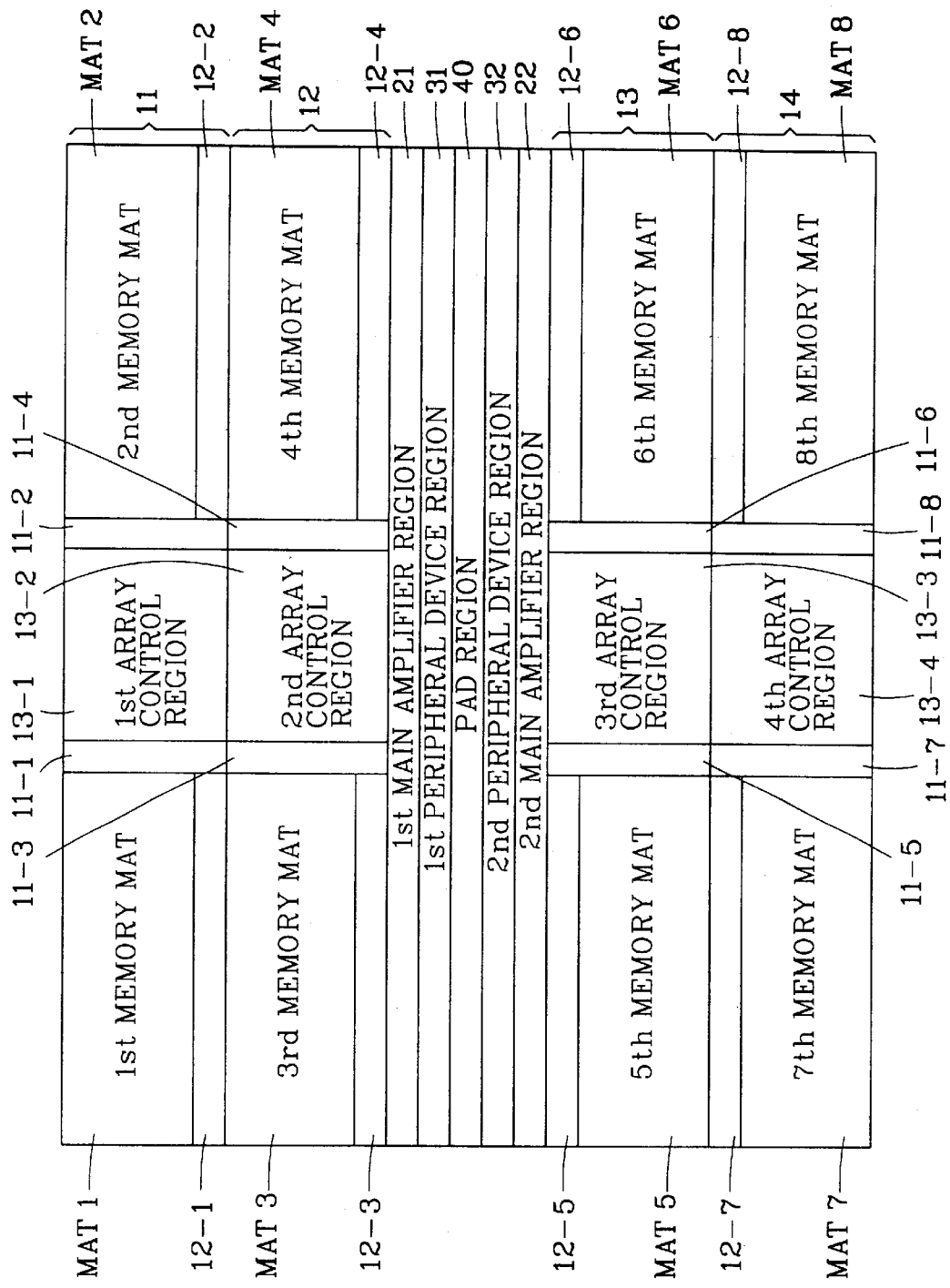
FIG. 4 is a block diagram illustrating a background art 128M SDRAM array.
Figure 5:
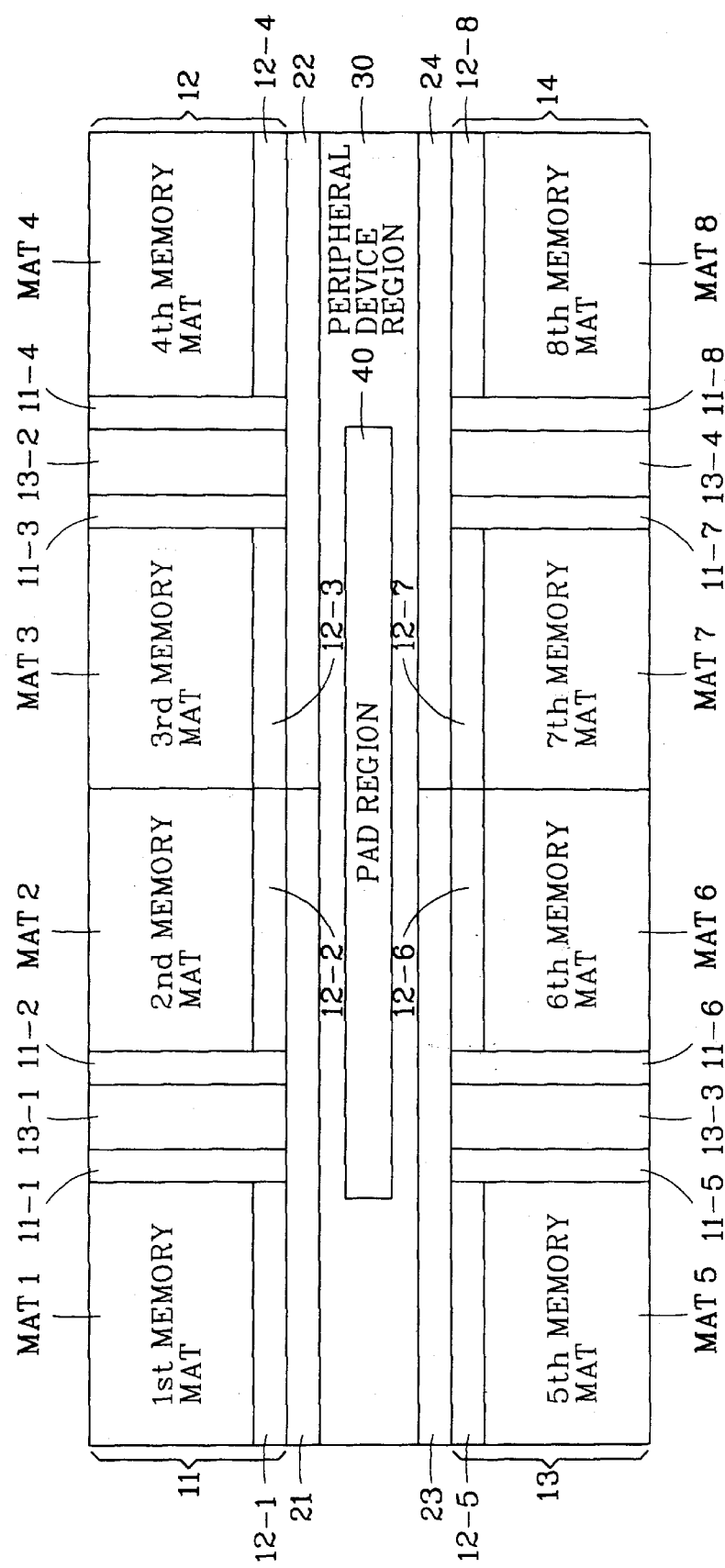
FIG. 5 is a block diagram illustrating another background art 128M SDRAM array.
Figure 6:
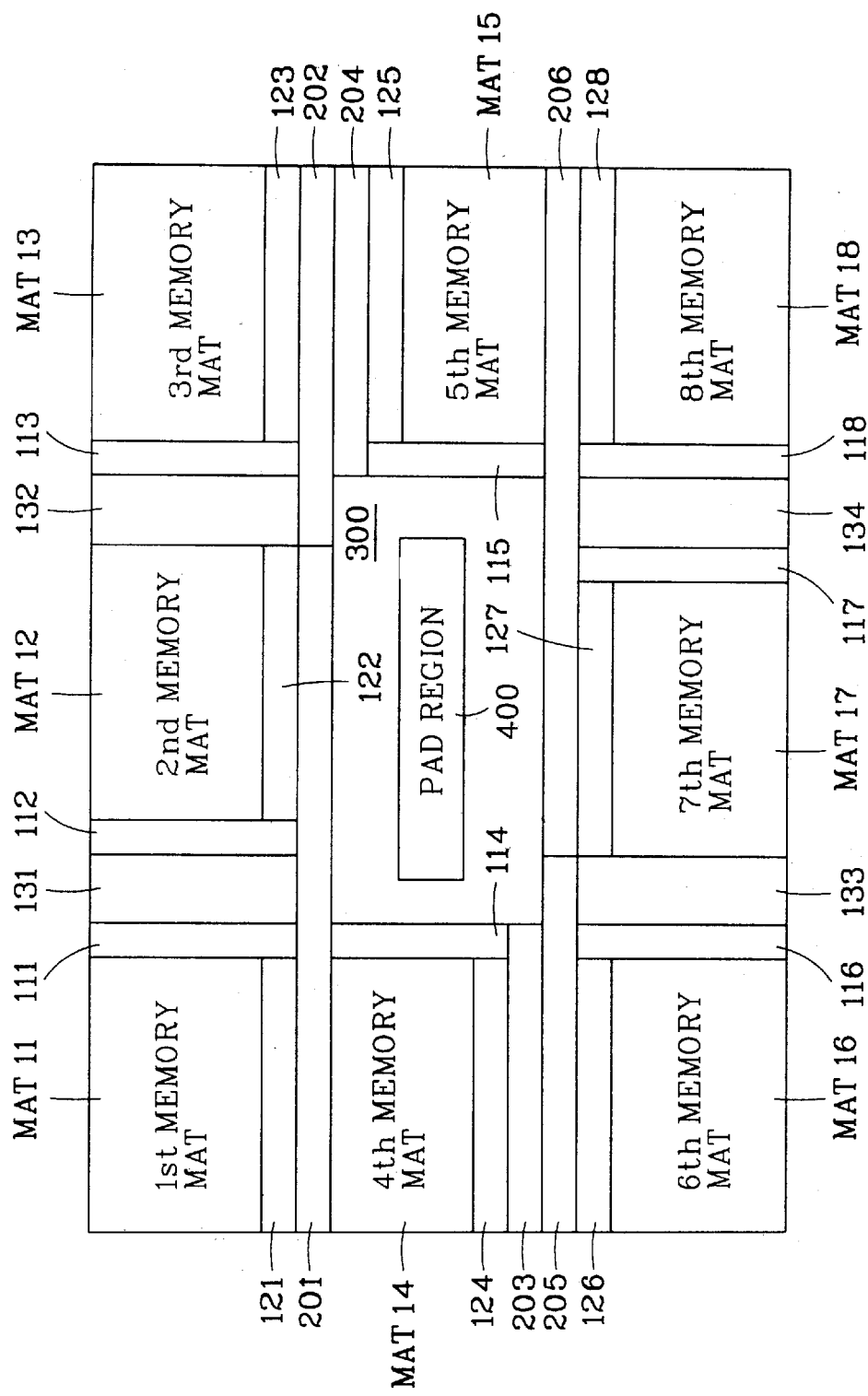
FIG. 6 is a block diagram illustrating a semiconductor memory array according to a first embodiment of the present invention.

FIG. 6 is a block diagram illustrating a semiconductor memory array according to a first embodiment of the present invention. As shown therein, a peripheral device region 300 is located at the center of the memory device. A pad region 400 is disposed in the peripheral device region 300. First to eighth 16M bits memory mats MAT11 to MAT18 are disposed at the periphery of the peripheral device region 300. First to eighth X decoders 111 to 118 are disposed at the left side or right side of the first to eighth memory mats MAT11 to MAT18.

First to eight Y decoders 121 to 128 are disposed at the upper end or lower end of the first to eighth memory mats MAT11 to MAT18. First and fourth array control regions 131, 134 are respectively disposed between the first and second X decoders 111, 112 and between the seventh and eighth X decoders 117, 118. Second and third array control regions 132, 133 are disposed adjacent to the third and sixth X decoders 113, 116, respectively. A first main amplifier region 201 is positioned at the lower end of an area including the first and second memory mats MAT11, MAT12, the first and second X decoders 111, 112, the first and second Y decoders 121, 122 and the first array control region 131. A second main amplifier region 202 is disposed at the lower end of an area including the third memory mat MAT13, the third X decoder 113, the third Y decoder 123 and the second array control region 132. A third main amplifier region 203 is located at the lower end of an area including the fourth memory mat MAT14, the fourth X decoder 114 and the fourth Y decoder 124. A fourth main amplifier region 204 is disposed at an upper end of an area including the fifth memory mat MAT5, the fifth X decoder 115 and the fifth Y decoder 125. A fifth main amplifier region 205 is disposed at an upper end of an area including the sixth memory mat MAT6, the sixth X decoder 116, the sixth Y decoder 126 and the third array control region 133. A sixth main amplifier region 206 is disposed at an upper end of an area including the seventh and eighth memory mats MAT7, MAT8, the seventh and eighth X decoders 117, 118, the seventh and eight Y decoders 127, 128 and the fourth array control region 134 so as to access the first to eighth memory mats MAT1 to MAT8.

Figure 7:
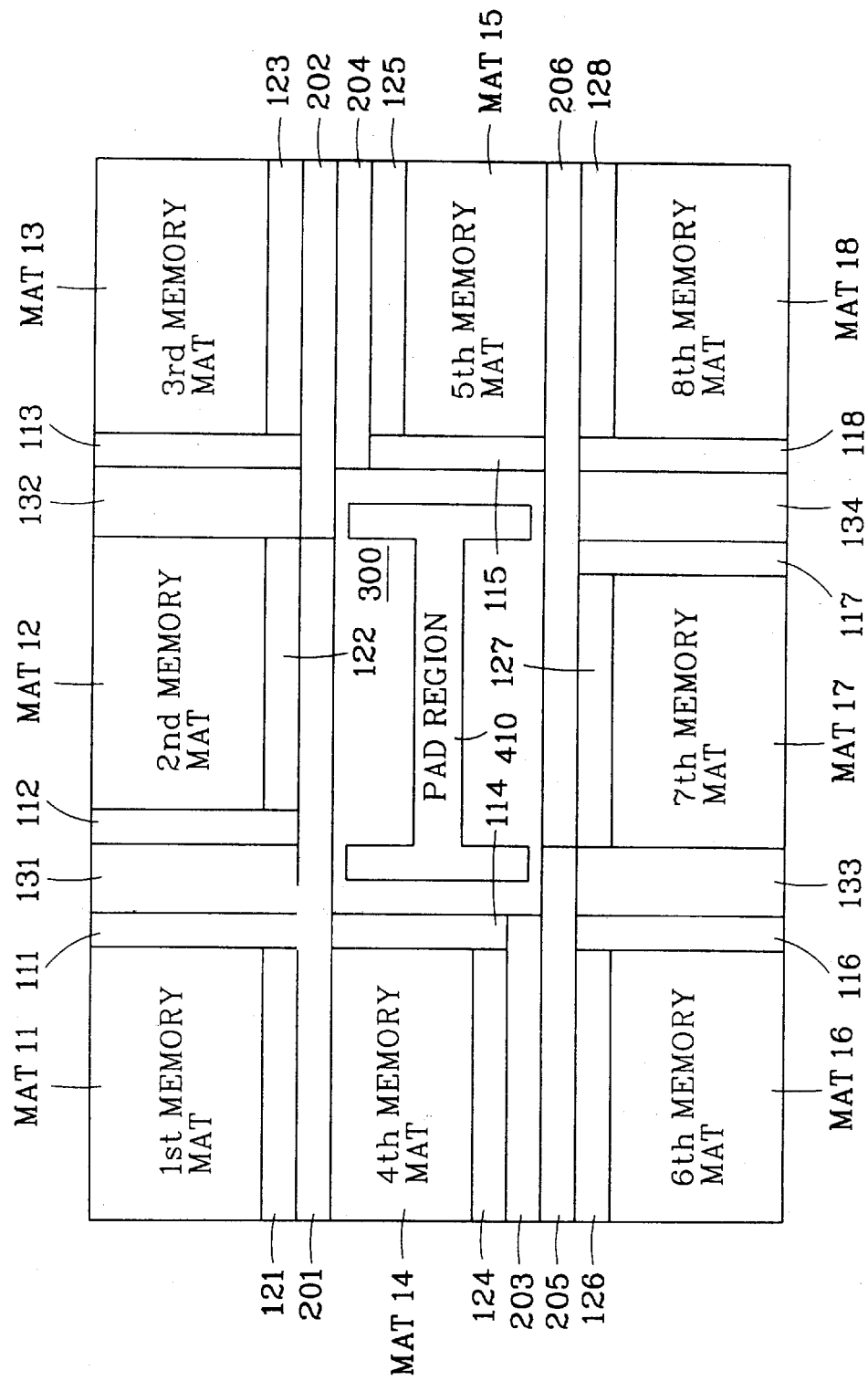
FIG. 7 is a block diagram illustrating a semiconductor memory array according to a second embodiment of the present invention.

FIG. 7 shows a second embodiment of the semiconductor memory array according to the present invention. The second embodiment is similar to the first embodiment except for a pad region 410 having an "H" pattern. Thus, for convenience, the same numerals are used for representing the same elements, and accordingly their description is omitted.

Figure 8:
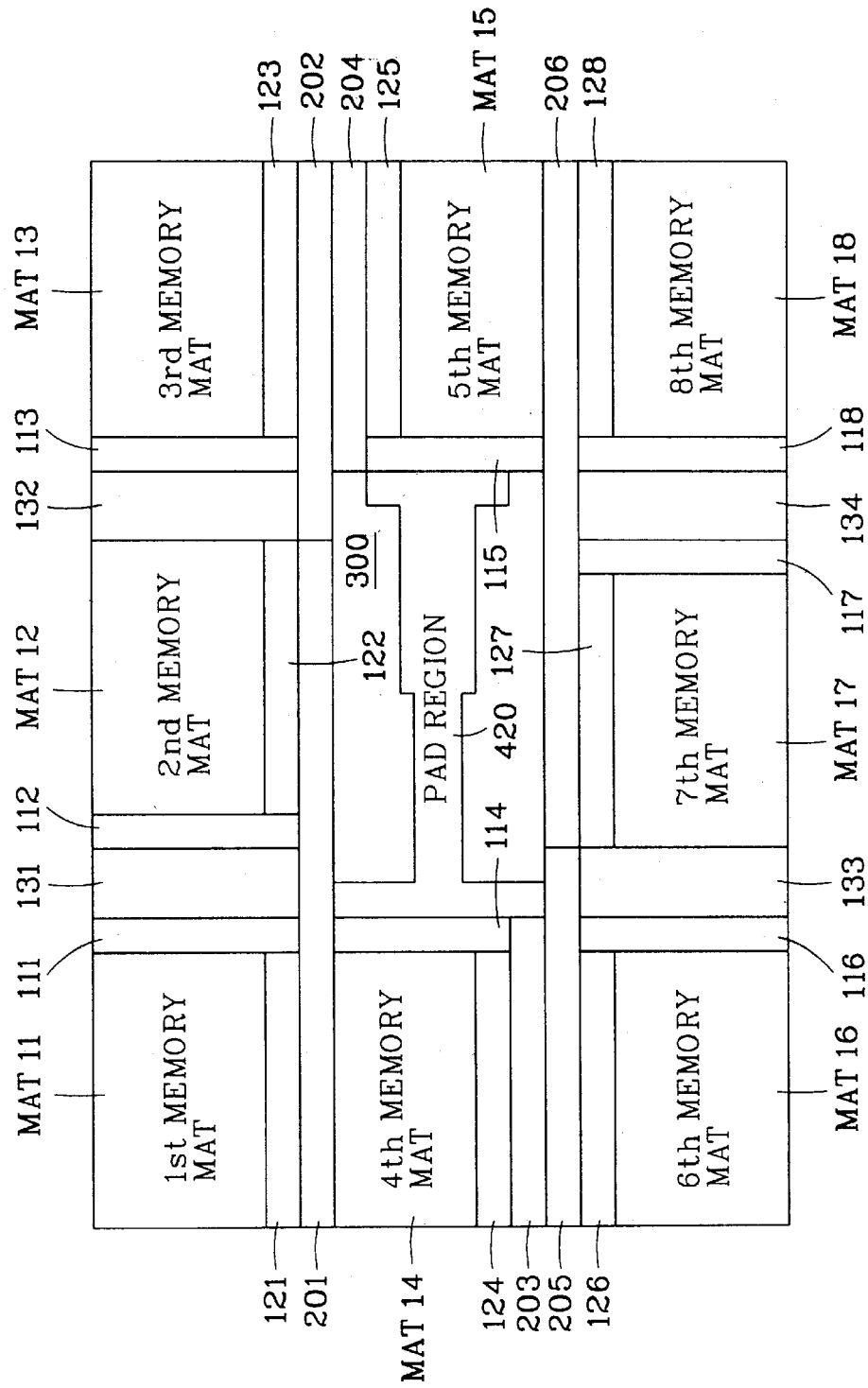
FIG. 8 is a block diagram illustrating a semiconductor memory array according to a third embodiment of the present invention.

FIG. 8 shows a third embodiment of a semiconductor memory array according to the present invention wherein the array is similar to that of FIG. 7. The third embodiment is similar to the second embodiment except for a pad region 420. In this embodiment, the pad region 420 having an "H" pattern is modified as shown in FIG. 8. For convenience, the same reference numerals are used for representing the same elements. Thus, the descriptions for those elements are also omitted.

In general, standard semiconductor memory products are implemented in 16M bits, 64M bits, and 256M bits, etc. Also, in between memory products such as 8M bits, 32M bits, 128M bits, and 512M bits, etc. may be realized for special occassions. However, in designing these products, problems in packaging and memory speed are ubiquitous. These problems cannot be resolved by simply increasing a major axial length or a minor axial length to increase memory size. However, the semiconductor memory array according to the present invention may be employed to solve the problems.

Figure 9:
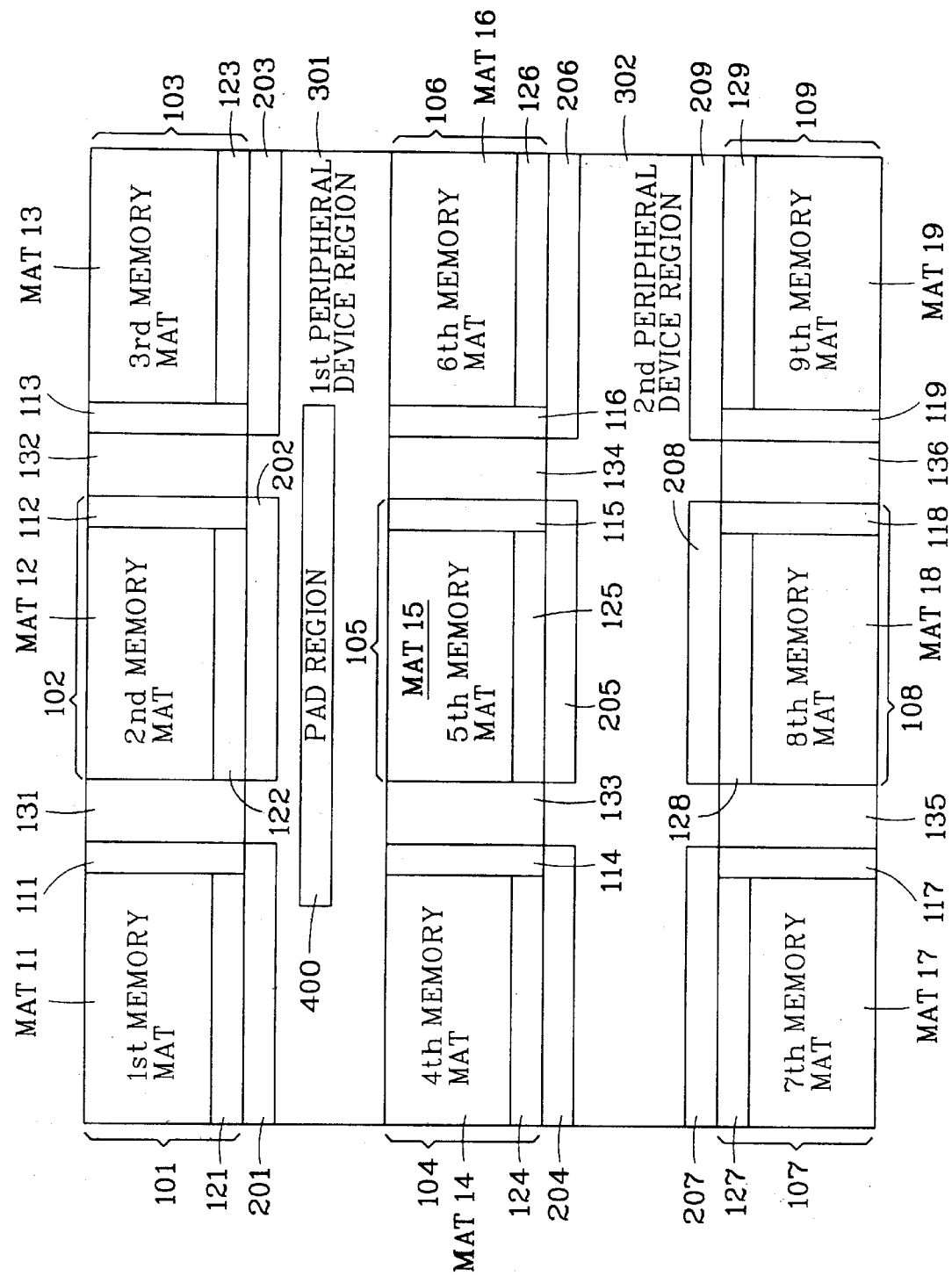
FIG. 9 is a block diagram illustrating a semiconductor memory array according to a fourth embodiment of the present invention.
Figure 10:
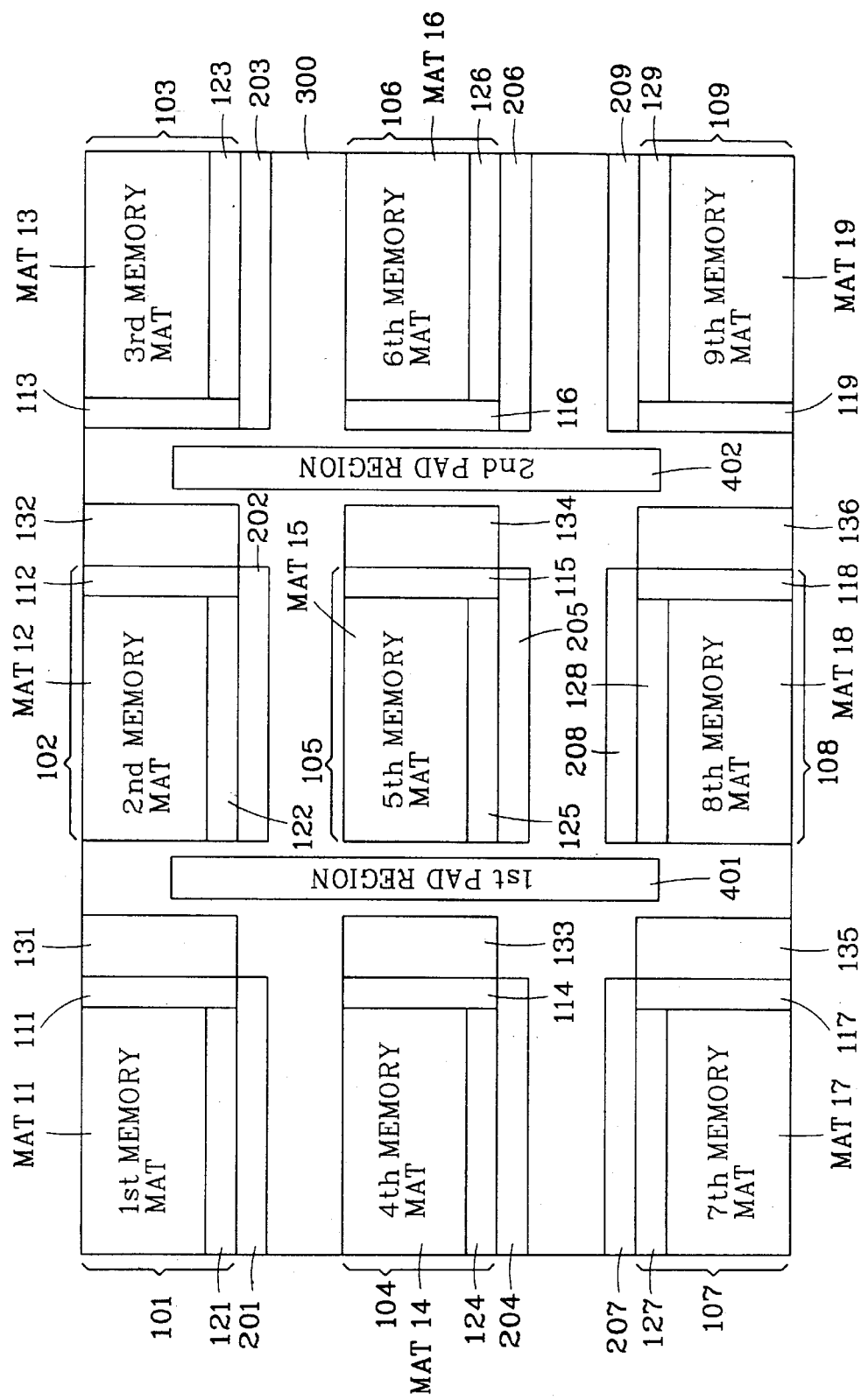
FIG. 10 is a block diagram illustrating a semiconductor memory array according to a fifth embodiment of the present invention.

Also, in order to fabricate a memory device having a parity X9 and X18, the semiconductor memory array according to the present invention is utilized by providing nine memory mats, as shown in FIGS. 9 and 10.

FIG. 9 is a block diagram illustrating a semiconductor memory array according to a fourth embodiment of the present invention. As shown therein, first to ninth 16M bits memory mats MAT11 to MAT19 are arranged in a checkerboard pattern. First to ninth X decoders 111 to 119 are disposed at the left side or right side of the first to ninth memory mats MAT11 to MAT19.

First to ninth Y decoders 121 to 129 are disposed at the upper end or lower end of the first to ninth memory mats MAT11 to MAT19. First to ninth main amplifier regions 201 to 209 are disposed at the upper end or lower end of the first to ninth memory mat regions 101 to 109 including the first to ninth memory mats MAT1 to MAT9, the first to ninth X decoders 111 to 119 and the first to ninth Y decoders 121 to 129. First, third and fifth array control regions 131, 133, 135 are disposed at the left side of the first, fourth and seventh X decoders 111, 114, 117. Second, fourth and sixth array control regions 132, 134, 136 are disposed between the second and third X decoders 112, 113, between the fifth and sixth X decoders 115, 116 and between the seventh and eighth X decoders 117, 118, respectively.

A first peripheral device region 301 is disposed between an area including the first to third memory mat regions 101 to 103, the first to third main amplifier regions 201 to 203 and the first and second array control regions 131, 132 and another area including the fourth to sixth memory mat regions 104 to 106, the fourth to sixth main amplifiers 204 to 206 and the third and fourth array control regions 133, 134. A second peripheral device region 302 is located between an area including the fourth to sixth memory mat regions 104 to 106, the fourth to sixth main amplifier regions 204 to 206 and the third and fourth array control regions 133, 134 and another area including the seventh to ninth memory mat regions 107 to 109, the seventh to ninth main amplifiers 207 to 209 and the fifth and sixth array control regions 135, 136. A pad region 400 is disposed within the first peripheral device region 301 so as to access the first to ninth memory mats MAT1 to MAT9.

FIG. 10 is a block diagram illustrating a semiconductor memory array according to a fifth embodiment of the present invention. Since the fifth embodiment is similar to the array shown in FIG. 9, the same elements are represented by the same reference numerals used in the fourth embodiment for convenience. Thus, their descriptions will be omitted. Differences from the fourth embodiment will now be explained.

As shown in FIG. 10, first to sixth array control regions 131 to 136 are disposed adjacent to first, second, fourth, fifth, seventh, and eighth X decoders 111, 112, 114, 115, 117, 118. A peripheral device region 300 is disposed in a "#" pattern between areas including the first to ninth memory mat regions 101 to 109, the first to ninth main amplifier regions 201 to 209 and the first to sixth array control regions 131 to 136. First and second pad regions 401, 402 are vertically disposed within the peripheral device region 300 so as to access the first to ninth memory mats MAT1 to MAT9.

Figure 11:
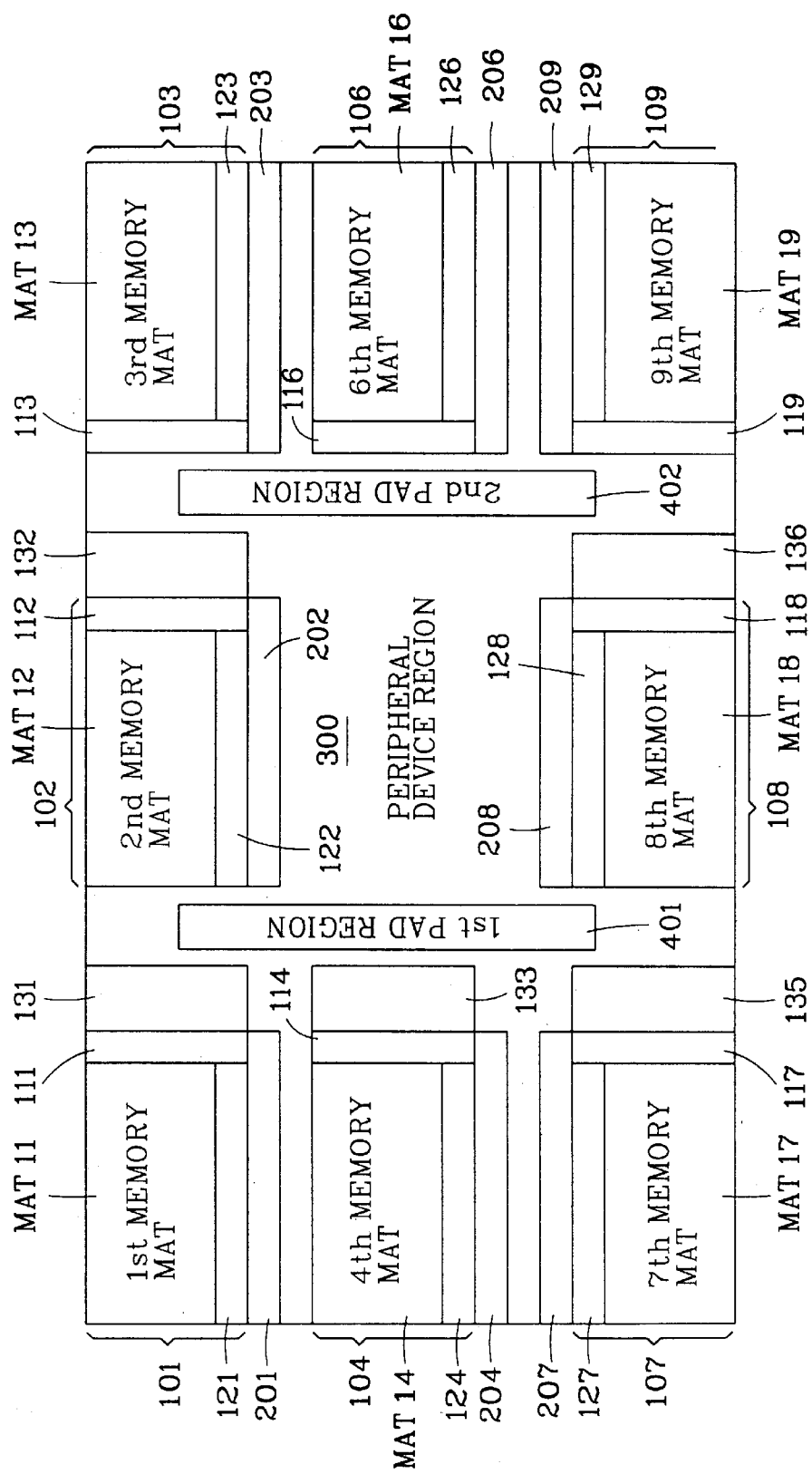
FIG. 11 is a block diagram illustrating a semiconductor memory array according to a sixth embodiment of the present invention.

FIG. 11 is a block diagram illustrating a semiconductor memory array according to a sixth embodiment of the present invention. The sixth embodiment is similar to the fifth embodiment as shown in FIG. 10. Accordingly, for convenience, the elements are represented by the same reference numerals used in the fifth embodiment and the descriptions for the same elements will be omitted. In the sixth embodiment, the fifth memory mat MAT15 disposed in the center is replaced by the peripheral device region 300.

As described above, the semiconductor memory array according to the present invention increases a packaging reliability since a major axial length. Further, it improves respective AC parameters as well as increases a memory speed.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A semiconductor memory array, comprising:
   a peripheral device region in a center portion of the array;
   a plurality of memory mat regions enclosing the peripheral device region;
   a pad region formed in the peripheral device region;
   a plurality of array control regions disposed between the memory mat regions, wherein each array control region is horizontally adjacent to at least one of the memory mat regions; and
   a plurality of main amplifier regions disposed between the memory mat regions and the peripheral device region, wherein the memory mat regions include a plurality of X decoders, Y decoders, and memory mats, and the peripheral device region contacts each of the plurality of main amplifier regions and at least two of the plurality of X decoders.

2. The semiconductor memory array according to claim 1, wherein the memory mat regions are formed in at least a 3×3 matrix.

3. The semiconductor memory array according to claim 1, wherein each X decoder contacts at least one of the memory mats.

4. The semiconductor memory array according to claim 1, wherein each Y decoder contacts at least one of the memory mats and at least one of the main amplifier regions.

5. The semiconductor memory array according to claim 1, wherein the pad region is formed in a rectangular shape.

6. The semiconductor memory array according to claim 1, wherein the pad region is formed to have one of singular and plural columns.

7. A semiconductor memory array, comprising:
   a plurality of memory mat regions arranged in a checkerboard pattern;
   an array control region disposed between horizontally adjacent memory mat regions;
   a peripheral device region disposed between vertically adjacent memory mat regions, wherein the peripheral device region is bordered by the horizontally adjacent memory mat regions and contacts the array control region; and
   a pad region disposed in the peripheral device region.

8. The semiconductor memory array according to claim 7, wherein the memory mat regions includes a plurality of X decoders, Y decoders, and memory mats.

9. The semiconductor memory array according to claim 8, wherein the X decoders and Y decoders are respectively disposed adjacent to vertical sides and horizontal sides of the respective memory mat regions.

10. The semiconductor memory array according to claim 8, wherein main amplifier regions are disposed adjacent to the Y decoders.

11. The semiconductor memory array according to claim 8, wherein main amplifier regions are disposed adjacent to the X decoders.

12. The semiconductor memory array according to claim 8, wherein the pad region is horizontally disposed in one of singular and plural columns in the peripheral device region.

13. A semiconductor memory array, comprising:
   a peripheral device region;
   a plurality of memory mat regions formed in a checkerboard pattern, wherein each of the memory mat regions contact the peripheral device region;
   a pad region formed in the peripheral device region;
   a plurality of array control regions between the memory mat regions, wherein each array control region is horizontally adjacent to at least one of the memory mat regions and contacts the peripheral device region; and
   a plurality of main amplifier regions disposed between the memory mat regions and the peripheral device region.

14. The semiconductor memory array according to claim 13, wherein the pad region includes first and second pad regions.

15. The semiconductor memory array according to claim 14, wherein the first and second pad regions are parallel to each other.

16. The semiconductor memory array according to claim 13, wherein the peripheral device region includes first and second peripheral device regions.

17. The semiconductor memory array according to claim 16, wherein the first and second peripheral device regions are parallel to each other.

18. A semiconductor memory array, comprising:
   a peripheral device region in a center portion of the array;
   a plurality of memory mat regions enclosing the peripheral device region;
   an "H" shaped pad region formed in the peripheral device region;
   a plurality of array control regions between the memory mat regions, each array control region horizontally adjacent to a memory mat region; and
   a plurality of main amplifier regions disposed between the memory mat regions and the peripheral device region.

19. A semiconductor memory array, comprising:
   a peripheral device region including first and second peripheral device regions;
   a plurality of memory mat regions formed in a checkerboard pattern, each memory mat region contacting the peripheral device region;
   a pad region formed in the peripheral device region and surrounded by the first peripheral device region;
   a plurality of array control regions between the memory mat regions, wherein each array control region is horizontally adjacent to a memory mat region; and
   a plurality of main amplifier regions disposed between the memory mat regions and the peripheral device region.

* * * * *